(12) United States Patent
Lee et al.

(10) Patent No.: US 7,420,423 B2
(45) Date of Patent: Sep. 2, 2008

(54) ACTIVE BALUN DEVICE

(75) Inventors: Young Jae Lee, Daejeon (KR); Hyun Kyu Yu, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 98 days.

(21) Appl. No.: 11/431,982

(22) Filed: May 11, 2006

(65) Prior Publication Data
US 2007/0069821 A1 Mar. 29, 2007

(30) Foreign Application Priority Data
Sep. 27, 2005 (KR) .................. 10-2005-0089721

(51) Int. Cl.
H03F 3/04 (2006.01)
(52) U.S. Cl. .................. 330/301; 330/254; 330/260
(58) Field of Classification Search ............. 330/301, 330/254, 260
See application file for complete search history.

(56) References Cited
U.S. PATENT DOCUMENTS

| | | | |
|---|---|---|---|
| 4,461,042 A * | 7/1984 | Tanabe et al. | ............. 455/333 |
| 5,889,432 A * | 3/1999 | Ho | ............. 330/253 |
| 6,566,961 B2 | 5/2003 | Dasgupta et al. | |
| 6,714,169 B1 | 3/2004 | Chau et al. | |
| 6,922,108 B2 * | 7/2005 | Lin | ............. 330/301 |
| 7,193,475 B2 * | 3/2007 | Su et al. | ............. 330/301 |

FOREIGN PATENT DOCUMENTS

| | | |
|---|---|---|
| JP | 10-209813 | 8/1998 |
| KR | 10 0240640 | 3/1999 |
| KR | 2001 0017641 | 3/2001 |
| KR | 1020020083607 | 11/2002 |
| KR | 2003-0062072 | 7/2003 |

OTHER PUBLICATIONS

Holdenried, C., et al. (2003) "Modified CMOS Cherry-Hooper Amplifiers with Source Follower Feedback in 0.35 μm Technology." IEEE. pp. 553-556.
'Design of an Original K-Band Active Balun With Improved Broadband Balanced Behavior' Viallon et al., IEEE Microwave and Wireless Components Letters, vol. 15, No. 4, Apr. 2005, pp. 280-282.
'A Novel Broadband Active Balun' Kawashima et al., 33rd European Microwave Conference, Munich 2003, pp. 495-498.
'Transimpedance amplifier for 10 Gigabit Ethernet Local Area Network Physical Layer' Le et al., Information and Communications University, Korea.
Korean Notice of Patent Grant date May 4, 2007 for the corresponding application KR 10-2005-0089721.

* cited by examiner

*Primary Examiner*—Patricia Nguyen
(74) *Attorney, Agent, or Firm*—Ladas & Parry LLP

(57) ABSTRACT

An active balun device is provided. The active balun device includes: a differential input portion for receiving an external single input signal to output two complementary differential signals; and a differential amplifier connected to the differential input portion in cascade to amplify the two differential signals received from the differential input portion. Thus, the active balun device has a sufficient gain and a desired bandwidth in a semiconductor circuit.

7 Claims, 2 Drawing Sheets

ACTIVE BALUN DEVICE

CROSS-REFERENCE TO RELATED APPLICATION

This application claims priority to and the benefit of Korean Patent Application No. 2005-89721, filed on Sep. 27, 2005, the disclosure of which is incorporated herein by reference in its entirety.

BACKGROUND

1. Field of the Invention

The present invention relates to an active balun device, and more particularly, to an active balun device having a sufficient gain and a desired bandwidth in a semiconductor circuit.

2. Discussion of Related Art

Generally, a common source field effect transistor (FET) and a common gate FET are widely used to constitute a wide-band amplifier, characteristics of which are very sensitive to processes and parasitic elements.

In a conventional active balun device, an input signal is provided to sources and gates of common gate and source FETs, and an output signal is derived at drains of the FETs. The signal input to the source is in phase with the output signal at the drain while the signal input to the gate is 180° out of phase with the output signal at the drain. Thus, a phase difference at the two output ports is 180°, realizing active balun. In this case, a change in bias of the transistors connected to the respective inputs and a change in a process leads to a great change in a phase and significantly affects the bandwidth.

Further, such a conventional active balun device has a balun characteristic very sensitive to the bias and sizes of respective devices.

As described above, the conventional active balun device obtains a 180° phase difference using transistors or broadens a bandwidth using an inductor peaking technique in a differential structure, but has a great-sized amplifier due to a change in transistors' performance and the use of the inductor.

SUMMARY OF THE INVENTION

The present invention is directed to implementation of an active balun device capable of obtaining differential output signals having a phase difference of 180° kept over a wide band with respect to a single-ended input signal so that the device has a flat gain curve, a sufficient gain, and a desired bandwidth.

One aspect of the present invention is to provide an active balun device comprising: a differential input portion for receiving an external single input signal to output two complementary differential signals; and a differential amplifier connected to the differential input portion in cascade to amplify the two differential signals received from the differential input portion.

The differential input portion may comprise: first and second NMOS transistors having sources connected in common and operating in response to the single input signal; an RC filter connected between the single input signal terminal and a ground and having a bias identical to a direct current (DC) bias of the single input signal; a third NMOS transistor having a drain and a source respectively connected to the sources of the first and second NMOS transistors and the ground and operating in response to an external bias voltage; fourth and fifth NMOS transistors having sources connected in common to the ground and gates respectively connected to the drains of the first and second NMOS transistors; first and second feedback resistors respectively connected between the gate and the drain of the fourth NMOS transistor and between the gate and the drain of the fifth NMOS transistor to adjust the bandwidth and gain of the differential input portion; and first and second load resistors respectively connected between the drain of the fourth NMOS transistor and a power supply voltage and between the drain of the fifth NMOS transistor and the power supply voltage.

The differential amplifier may comprise: sixth and seventh NMOS transistors having sources connected in common, and gates respectively connected to the drains of the fourth and fifth NMOS transistors; an eighth NMOS transistor having a drain and a source respectively connected to the sources of the sixth and seventh NMOS transistors and the ground and operating in response to the bias voltage; ninth and tenth NMOS transistors having drains and sources respectively connected to an output terminal and the ground, and gates respectively connected to the drains of the sixth and seventh NMOS transistors; third and fourth feedback resistors respectively connected between the gate and the drain of the ninth NMOS transistor and between the gate and the drain of the tenth NMOS transistor to adjust the bandwidth and gain of the differential amplifier; and third and fourth load resistors connected between the power supply voltage and the output terminal.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, an exemplary embodiment of the present invention will be described in detail. However, the present invention is not limited to the embodiments disclosed below, but can be implemented in various types. Therefore, the present embodiment is provided for complete disclosure of the present invention and to fully inform the scope of the present invention to those ordinarily skilled in the art.

Figure 1:
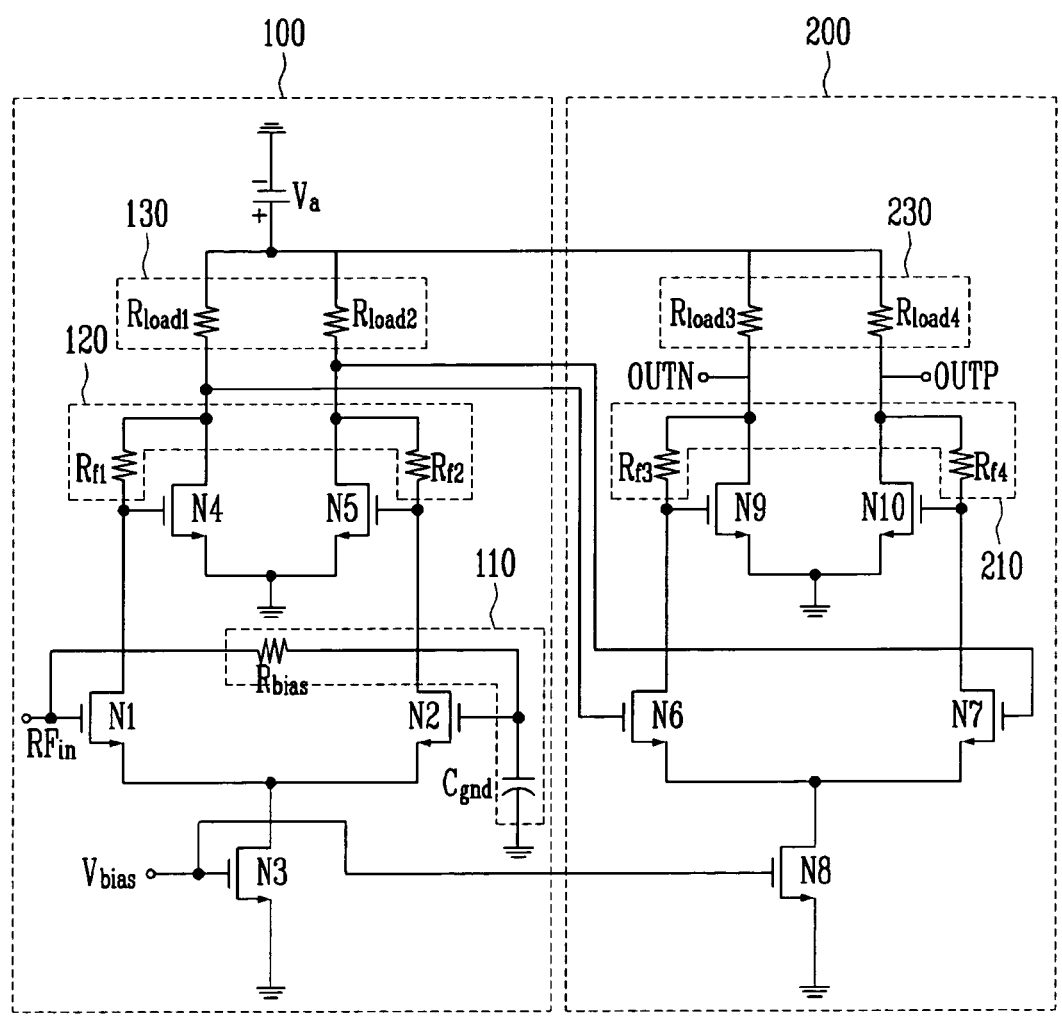
FIG. 1 is a circuit diagram of an active balun device according to an embodiment of the present invention.

FIG. 1 is a circuit diagram of an active balun device according to an embodiment of the present invention.

Referring to FIG. 1, the active balun device according to an embodiment of the present invention includes a differential input portion 100 for receiving an external single radio frequency (RF) input signal, i.e., a single-ended RF input signal $RF_{in}$ to output two complementary differential signals; and a differential amplifier 200 connected to the differential input portion 100 in cascade for amplifying the two differential signals received from the differential input portion 100.

The differential input portion 100 includes first to fifth NMOS transistors N1 to N5, an RC filter 110, feedback resistors 120 $R_{f1}$ and $R_{f2}$, and load resistors 130 $R_{load1}$ and $R_{load2}$.

The first and second NMOS transistors N1 and N2 have sources connected in common to the drain of the third NMOS transistor N3, drains respectively connected to gates of the fourth and fifth NMOS transistors N4 and N5, and gates connected to the single input signal ($RF_{in}$) terminal in common, and operate in response to the single input signal $RF_{in}$.

The third NMOS transistor N3 has a drain and a source connected respectively to the sources of the first and second NMOS transistors N1 and N2 and a ground, and a gate connected to an external bias voltage $V_{bias}$, and operates in response to the bias voltage $V_{bias}$.

The fourth and fifth NMOS transistors N4 and N5 have sources connected in common to the ground, and gates connected respectively to the drains of the first and second NMOS transistors N1 and N2.

The RC filter 110 is an RC low pass filter (LPF) and includes a bias resistor $R_{bias}$ and a capacitor $C_{gnd}$ connected in series between the single input signal $RF_{in}$ terminal and the ground.

In the RC filter 110, since the capacitor $C_{gnd}$ should have a great capacitance to enable the single input signal $RF_{in}$ to be grounded, an MOS capacitor, which is an active capacitor, is used as the capacitor $C_{gnd}$. The bias resistor $R_{bias}$ should have a bias identical to a direct current (DC) bias of the input signal.

The RC filter 110 provides a substantial direct current together with a cutoff frequency of several tens KHz. While the output signal may contain some alternate current (AC) components, the RC filter provides a sufficient filtering effect to output a direct current (DC) and not to affect the performance of the circuit.

The feedback resistors 120 $R_{f1}$ and $R_{f2}$ are connected between the gates and the drains of the fourth and fifth NMOS transistors N4 and N5, respectively.

The bandwidth and the gain of the device can be changed by adjusting the resistances of the feedback resistors 120 $R_{f1}$ and $R_{f2}$. That is, adjusting the resistance can lead to increase of the gain with a reduced bandwidth or increase of the bandwidth with a reduced gain.

The load resistors 130 $R_{load1}$ and $R_{load2}$ are respectively connected between the drains of the fourth and fifth NMOS transistors N4 and N5 and a power supply voltage Va.

The differential amplifier 200 amplifies (i.e., increases the sizes of waveforms of) the two small differential signals received from the differential input portion 100 to the extent that any subsequent circuit recognizes the differential signals, and reduces a phase error.

The differential amplifier 200 includes sixth to tenth NMOS transistors N6 to N10, feedback resistors 210 $R_{f3}$ and $R_{f4}$, and load resistors 230 $R_{load3}$ and $R_{load4}$.

The sixth and seventh NMOS transistors N6 and N7 have sources connected in common to the drain of the eighth NMOS transistor N8, drains connected respectively to the gates of the ninth and tenth NMOS transistors N9 and N10, and gates connected respectively to the drains of the fourth and fifth NMOS transistors N4 and N5.

The eighth NMOS transistor N8 has the drain and the source connected respectively to a common node of the sources of the sixth and seventh NMOS transistors N6 and N7 and the ground, and a gate connected to the bias voltage $V_{bias}$, and operates in response to the bias voltage $V_{bias}$.

The ninth NMOS transistor N9 has a drain and a source connected respectively to an output OUTN and the ground, and a gate connected to the drain of the sixth NMOS transistor N6. The tenth NMOS transistor N10 has a drain and a source respectively connected to an output OUTP and the ground, and a gate connected to the drain of the seventh NMOS transistor N7.

The feedback resistors 210 $R_{f3}$ and $R_{f4}$ are connected between the gate and the drain of the ninth NMOS transistor N9 and between the gate and the drain of the tenth NMOS transistor N10, respectively.

The bandwidth and the gain of the differential amplifier can be changed by adjusting the resistances of the feedback resistors 210 $R_{f3}$ and $R_{f4}$. That is, adjusting the resistances can lead to increase of the gain with a reduced bandwidth or increase of the bandwidth with a reduced gain.

The load resistors 230 $R_{load3}$ and $R_{load4}$ are connected between the output OUTN and the power supply voltage Va and between the output OUTP and the power supply voltage Va, respectively.

Thus, in the active balun device according to an embodiment of the present invention, one of the two differential inputs of the differential input portion 100 is connected to the single-ended input signal and the other is connected to the ground. The device generates two output signals having the size of one half the input signal and a phase difference of 180°.

Here, the output signal at the ground of the two output signals has a size smaller than the other. This requires for the amplifier to increase the sizes of the output signals in order to reduce a difference between the output signals while maintaining the phase difference of 180°.

The resistances of the feedback resistors 120 and 210 applied to the present invention can be adjusted to change the wide-band characteristic and the gain of the device. The drain resistances, i.e., the resistances of the load resistors 130 and 230 of the fourth, fifth, ninth and tenth NMOS transistors N4, N5, N9 and N10, and bias currents of the respective transistors can be adjusted so that the transistors operates in a saturation area.

According to an embodiment of the present invention, the active balun device applied to a wireless or wired circuit can improve the overall performance of the circuit. The wireless circuit may be used to obtain differential outputs of a differential mixer input stage and the wired circuit may be used to obtain differential TIA outputs. This can provide an active balun circuit having a phase difference of 180° without increasing the area.

Meanwhile, in the active balun device according to an embodiment of the present invention, each of the differential input portion 100 and the differential amplifier 200 is implemented by a typical Cherry-Hooper amplifier, and a detailed description of it will be omitted.

Figure 2:
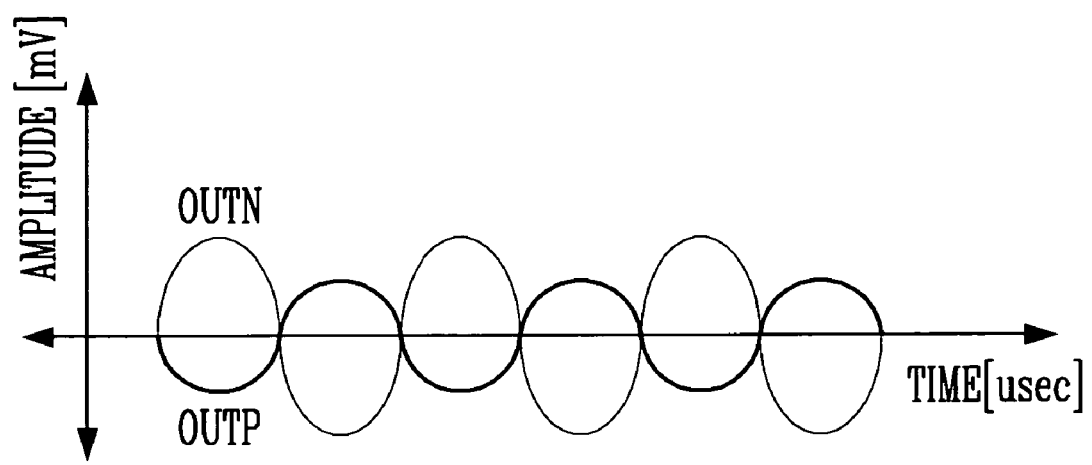
FIG. 2 is a graph illustrating an output waveform of an active balun device according to an embodiment of the present invention.

FIG. 2 is a graph illustrating an output waveform of an active balun device that is obtained through simulation according to an embodiment of the present invention.

Referring to FIG. 2, there is a difference in waveform sizes of the final output signals (OUTN and OUTP) between the output corresponding to the single-ended input signal $RF_{in}$ (identical to the OUTP output signal) at the signal input terminal and the output corresponding to the ground.

However, a phase difference, which is the most critical, is kept as 180° in a desired frequency band, and the waveform sizes of the output signals OUTN and OUTP may be made identical to each other through a limiting or variable amplifier at a subsequent stage, i.e., the differential amplifier 200.

As described above, the active balun device of the present invention includes a differential input portion for receiving an external single input signal to output two complementary differential signals; and a differential amplifier connected to the differential input portion in cascade for amplifying the two differential signals received from the differential input portion. Thus, it is possible to obtain differential output signals having a phase difference of 180° kept over a wide band with respect to the single-ended input signal, such that the active balun device has a flat gain curve, a sufficient gain, and a desired bandwidth. In addition, the active balun device of the present invention can be applied to a wireless or wired circuit to improve the overall performance of the circuit.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An active balun device comprising:
   a differential input portion for receiving an external single input signal to output two complementary differential signals; and
   a differential amplifier connected to the differential input portion in cascade to amplify the two differential signals received from the differential input portion;
   wherein the differential input portion and the differential amplifier include feedback resistors to adjust the bandwidth and gain of the active balum device.

2. An active balun device comprising:
   a differential input portion for receiving an external single input signal to output two complementary differential signals; and
   a differential amplifier connected to the differential input portion in cascade to amplify the two differential signals received from the differential input portion;
   wherein the differential input portion comprises:
   first and second NMOS transistors having sources connected in common and operating in response to the single input signal;
   an RC filter connected between the single input signal terminal and a ground and having a bias identical to a direct current (DC) bias of the single input signal;
   a third NMOS transistor having a drain and a source respectively connected to the sources of the first and second NMOS transistors and the ground and operating in response to an external bias voltage;
   fourth and fifth NMOS transistors having sources connected in common to the ground and gates respectively connected to the drains of the first and second NMOS transistors;
   first and second feedback resistors respectively connected between the gate and the drain of the fourth NMOS transistor and between the gate and the drain of the fifth NMOS transistor to adjust the bandwidth and gain of the differential input portion; and
   first and second load resistors respectively connected between the drain of the fourth NMOS transistor and a power supply voltage and between the drain of the fifth NMOS transistor and the power supply voltage.

3. An active balun device comprising:
   a differential input portion for receiving an external single input signal to output two complementary differential signals; and
   a differential amplifier connected to the differential input portion in cascade to amplify the two differential signals received from the differential input portion;
   wherein the differential amplifier comprises;
   sixth and seventh NMOS transistors having sources connected in common, and gates respectively connected to the drains of the fourth and fifth NMOS transistors;
   an eighth NMOS transistor having a drain and a source respectively connected to the sources of the sixth and seventh NMOS transistors and the ground and operating in response to the bias voltage;
   ninth and tenth NMOS transistors having drains and sources respectively connected to an output terminal and the ground, and gates respectively connected to the drains of the sixth and seventh NMOS transistors;
   third and fourth feedback resistors respectively connected between the gate and the drain of the ninth NMOS transistor and between the gate and the drain of the tenth NMOS transistor to adjust the bandwidth and gain of the differential amplifier; and
   third and fourth load resistors connected between the power supply voltage and the output terminal.

4. The active balun device according to claim 2, wherein the differential amplifier comprises:
   sixth and seventh NMOS transistors having sources connected in common, and gates respectively connected to the drains of the fourth and fifth NMOS transistors;
   an eighth NMOS transistor having a drain and a source respectively connected to the sources of the sixth and seventh NMOS transistors and the ground and operating in response to the bias voltage;
   ninth and tenth NMOS transistors having drains and sources respectively connected to an output terminal and the ground, and gates respectively connected to the drains of the sixth and seventh NMOS transistors;
   third and fourth feedback resistors respectively connected between the gate and the drain of the ninth NMOS transistor and between the gate and the drain of the tenth NMOS transistor to adjust the bandwidth and gain of the differential amplifier; and
   third and fourth load resistors connected between the power supply voltage and the output terminal.

5. The active balun device according to claim 1, wherein the differential input portion further comprises:
   first and second NMOS transistors having sources connected in common and operating in response to the single input signal;
   an RC filter connected between the single input signal terminal and a ground and having a bias identical to a direct current (DC) bias of the single input signal;
   a third NMOS transistor having a drain and a source respectively connected to the sources of the first and second NMOS transistors and the ground and operating in response to an external bias voltage;
   fourth and fifth NMOS transistors having sources connected in common to the ground and gates respectively connected to the drains of the first and second NMOS transistors;
   first and second load resistors respectively connected between the drain of the fourth NMOS transistor and a power supply voltage and between the drain of the fifth NMOS transistor and the power supply voltage; and
   wherein the feedback resistors of the differential input portion include a first and a second feedback resistor respectively connected between the gate and the drain of the fourth NMOS transistor and between the gate and the drain of the fifth NMOS transistor to adjust the bandwidth and gain of the differential input portion.

6. The active balun device according to claim 1 wherein the differential amplifier comprises:
   sixth and seventh NMOS transistors having sources connected in common, and gates respectively connected to the drains of the fourth and fifth NMOS transistors;
   an eighth NMOS transistor having a drain and a source respectively connected to the sources of the sixth and seventh NMOS transistors and the ground and operating in response to the bias voltage;

ninth and tenth NMOS transistors having drains and sources respectively connected to an output terminal and the ground, and gates respectively connected to the drains of the sixth and seventh NMOS transistors;

third and fourth load resistors connected between the power supply voltage and the output terminal; and wherein the feedback resistors of the differential amplifier include third and fourth feedback resistors respectively connected between the gate and the drain of the ninth NMOS transistor and between the gate and the drain of the tenth NMOS transistor to adjust the bandwidth and gain of the differential amplifier.

7. The active balun device according to claim 5 wherein the differential amplifier comprises:

sixth and seventh NMOS transistors having sources connected in common, and gates respectively connected to the drains of the fourth and fifth NMOS transistors;

an eighth NMOS transistor having a drain and a source respectively connected to the sources of the sixth and seventh NMOS transistors and the ground and operating in response to the bias voltage;

ninth and tenth NMOS transistors having drains and sources respectively connected to an output terminal and the ground, and gates respectively connected to the drains of the sixth and seventh NMOS transistors;

third and fourth load resistors connected between the power supply voltage and the output terminal; and wherein the feedback resistors of the differential amplifier include third and fourth feedback resistors respectively connected between the gate and the drain of the ninth NMOS transistor and between the gate and the drain of the tenth NMOS transistor to adjust the bandwidth and gain of the differential amplifier.

* * * * *